(12) United States Patent
Tsuji

(10) Patent No.: US 7,038,304 B2
(45) Date of Patent: May 2, 2006

(54) SEMICONDUCTOR MEMORY DEVICE AND MANUFACTURING METHOD THEREOF

(75) Inventor: Naoki Tsuji, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/895,089

(22) Filed: Jul. 21, 2004

(65) Prior Publication Data

US 2005/0032310 A1 Feb. 10, 2005

(30) Foreign Application Priority Data

Aug. 7, 2003 (JP) .............................. 2003-288849

(51) Int. Cl.
*H01L 23/58* (2006.01)

(52) U.S. Cl. ....................................... 257/649; 257/296

(58) Field of Classification Search ................ 257/649, 257/68, 411, 412, 510, 622, 647, 646
See application file for complete search history.

(56) References Cited

U.S. PATENT DOCUMENTS

| | | | | |
|---|---|---|---|---|
| 5,768,192 A | * | 6/1998 | Eitan | 365/185.24 |
| 6,768,161 B1 | * | 7/2004 | Kinoshita | 257/316 |
| 6,881,994 B1 | * | 4/2005 | Lee et al. | 257/296 |

FOREIGN PATENT DOCUMENTS

| | | |
|---|---|---|
| JP | 10-12750 | 1/1998 |
| JP | 2000-91450 | 3/2000 |
| JP | 2001-351993 | 12/2001 |

* cited by examiner

*Primary Examiner*—David Nhu
(74) *Attorney, Agent, or Firm*—McDermott Will & Emery LLP

(57) ABSTRACT

A semiconductor memory device includes: a silicon substrate having a main surface; $n^+$ diffusion layers formed on the main surface of the silicon substrate distanced from each other; HDP oxide films formed on the $n^+$ diffusion layers and deposited on the main surface so as to protrude above the main surface; an ONO film (a stacked film of an oxide film, a nitride film, and an oxide film) as a charge holding layer formed between the HDP oxide films; and a gate electrode (a polysilicon film and a doped polysilicon film) extending over the ONO film and the HDP oxide films.

2 Claims, 4 Drawing Sheets

SEMICONDUCTOR MEMORY DEVICE AND MANUFACTURING METHOD THEREOF

BACKGROUND OF THE INVENTION

1. Field of the Invention

The present invention relates to a semiconductor memory device and manufacturing method thereof, and particularly, to a non-volatile semiconductor memory device using an ONO (Oxide-Nitride-Oxide) film as an electric charge holding layer and a manufacturing method thereof.

2. Description of the Background Art

Conventionally, among non-volatile semiconductor memory devices, for example an SONOS (Silicon-Oxide-Nitride-Oxide-Semiconductor) type non-volatile semiconductor device has been known as a structure particularly suitable for miniaturization.

In the following, the procedure of forming a cell array in a conventional SONOS type semiconductor memory device is described.

First, on a silicon substrate, a three-layer structured film of an oxide film, a nitride film, and an oxide film (an ONO film) is formed by CVD (Chemical Vapor Deposition) method or the like. This ONO film serves as a charge holding layer in the cell.

Next, after removing the ONO film using a resist pattern which has an opening in a diffusion layer interconnection region portion of the cell array, for example arsenic is injected (as for ion concentration, for example about $3.0 \times 10^{15}$ ($1/cm^2$)) to form an $n^+$ diffusion layer region.

Then, by removing the resist and oxidizing the $n^+$ diffusion layer region, an element isolating region is formed thereon. Here, regions except for the diffusion layer region are not oxidized by the effect of the remaining nitride film of the ONO film.

Further, a polysilicon or the like to be a gate electrode is deposited by CVD method or the like. Then, a word line pattern is formed by a resist, and the polysilicon is removed from the regions except for the gate electrode.

Through the process described above, the cell of the SONOS type semiconductor memory device is formed.

The manufacturing method of the semiconductor memory device as described above, however, has been associated with the following problem.

In the procedure of the cell array portion formation described above, the ONO film is removed with a prescribed pattern, to which the $n^+$ diffusion layer region is formed. On the diffusion layer region surface, a region formed by LOCOS (Local Oxidation of Silicon) method as an element isolating region is formed. Thus, ONO films among each element are isolated.

Here, in the step of forming the region formed by LOCOS method (the LOCOS region), sometimes the diffusion layer (such as arsenic) diffuses in the gate length direction by a thermal oxidation process, whereby the effective gate length of the cell becomes short. This hinders miniaturization (scaling) of the cell size.

On the other hand, a SONOS type semiconductor memory device has been produced, which is manufactured without forming LOCOS region and etching the ONO film for isolation, considering the effect to the gate length.

In this case, however, the ONO film will be used as a through film for transmitting the injected diffusion layer (arsenic), whereby the electric reliability of the ONO film (the charge holding layer) is degraded. Further, since the ONO film is not isolated among each element, when the cell size is reduced, charges may diffuse and thus affect adjacent cells.

Japanese Patent Laying-Open No. 2001-351993 (Conventional Example 1) discloses a semiconductor memory device in which an HDP oxide film is embedded in concave portions of a silicon substrate and polished through CMP method, so that the HDP oxide film is left only on an impurity diffusion region.

Japanese Patent Laying-Open No. 2000-091450 (Conventional Example 2) discloses a non-volatile semiconductor memory device in which a titanium-silicide film is formed on the surfaces of source, a drain diffusion layer and a control gate electrode in order to reduce resistance.

Japanese Patent Laying-Open No. 10-012750 (Conventional Example 3) discloses a non-volatile semiconductor memory device in which a floating gate electrode serving as a charge holding portion of a memory cell is formed by two layers of polycrystalline silicon films electrically connected to each other. A silicon oxide film is formed between the two layers of polycrystalline silicon films and a word line (a polycrystalline silicon film).

Conventional Example 1, however, discloses a non-volatile memory including a floating gate electrode and a control gate electrode, of which basis is totally different from the present invention having an ONO film as a charge holding layer.

As for Conventional Example 2, it does not disclose a structure in which a gate electrode is arranged perpendicular to a diffusion layer to which a silicide film is formed, and therefore the semiconductor memory device according to Conventional Example 2 and the semiconductor memory device according to the present invention are totally different in the structure.

As for Conventional Example 3, two layers of polycrystalline silicon films serve as charge holding layers, and therefore it is different from the present invention in which an ONO film is used as the charge holding layer.

SUMMARY OF THE INVENTION

The present invention is made in light of the problems described above, and an object of the present invention is to provide a semiconductor memory device including an ONO film as a charge holding layer, that prevents the effective gate length from becoming short and has a structure suitable for miniaturization of the cell size, and to provide a manufacturing method thereof.

A semiconductor memory device according to the present invention includes: a semiconductor substrate having a main surface; first and second impurity regions formed on the main surface of the semiconductor substrate distanced from each other; first and second insulating films formed on the first and second impurity regions, respectively, and deposited on the main surface so as to protrude above the main surface; an ONO (Oxide-Nitride-Oxide) film formed between the first and second insulating films; and a gate electrode extending over the ONO film and the first and second insulating films.

A method for manufacturing a semiconductor memory device according to the present invention includes the steps of forming an ONO film on a main surface of a semiconductor substrate; forming a first conductive film on the ONO film and forming a mask film on the first conductive film; performing etching using the mask film and thereby forming an opening reaching the main surface through the ONO film and the first conductive film; forming an impurity region by injecting an impurity into a surface of the semiconductor substrate inside the opening; depositing an insulating film inside the opening; removing the mask film; and forming a second conductive film so as to cover the first conductive film and the insulating film.

According to the present invention, insulation between an impurity region and a gate electrode can be implemented without forming an LOCOS region in a semiconductor memory device including an ONO film as a charge holding layer. Therefore, the effective gate length can be prevented from becoming short due to diffusion of an impurity caused by a thermal oxidation process.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

In the following, referring to FIGS. 1–11, an embodiment of a semiconductor memory device and a manufacturing method thereof according to the present invention will be described.

Figure 10:
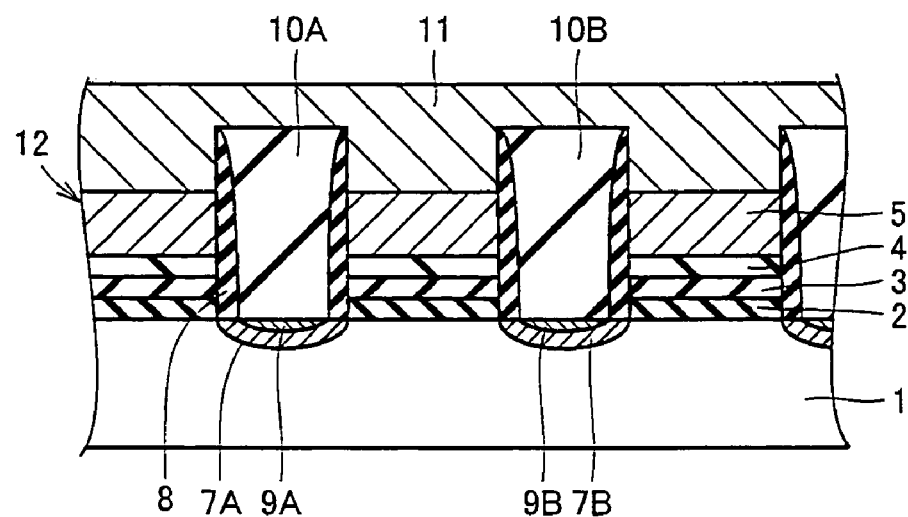
FIG. 10 is a cross-sectional view of a semiconductor memory device according to one embodiment of the present invention.

The semiconductor memory device according to the present embodiment is a SONOS (Silicon-Oxide-Nitride-Oxide-Semiconductor) memory, and as shown in FIG. 10, it includes: a silicon substrate 1 as a semiconductor substrate having a main surface; $n^+$ diffusion layer(s) 7 (7A and 7B) as first and second impurity regions formed on the main surface of silicon substrate 1 distanced from each other; HDP oxide film(s) 10 (10A and 10B) as first and second insulating films formed on $n^+$ diffusion layers 7 (7A and 7B), respectively, and deposited on the main surface so as to protrude above the main surface; an ONO film (a stacked film of oxide film 2, nitride film 3, and oxide film 4) formed between HDP oxide films 10A and 10B; and a gate electrode (polysilicon film 5 and doped polysilicon film 11) extending over ONO film 2, 3 and 4 and HDP oxide films 10A and 10B.

It is noted that, an upper surface of HDP oxide films 10 is positioned higher than an upper surface of ONO film 2, 3 and 4. Gate electrode 5 and 11 has a downwardly-protruding portion 12 on ONO film 2, 3 and 4. A sidewall insulating film 8 is formed on a sidewall of protruding portion 12 and reaching the impurity region. Suicide film(s) 9 (9A and 9B) is formed at a surface of n+ diffusion layer 7 that is not covered by sidewall insulating film 8.

An HDP oxide film means an oxide film formed using high density plasma (HDP).

In the structure described above, the gate electrode (polysilicon film 5 and doped polysilicon film 11) and $n^+$ diffusion layer 7 are insulated by HDP oxide film 10. Accordingly, the step of forming an LOCOS region can be eliminated in forming a cell of a SONOS memory. Thus, the effective gate length is prevented from becoming short due to diffusion of an impurity region facilitated by a thermal processing in that step. As a result, it is advantageous in scaling of SONOS memory.

In a conventional SONOS memory, sometimes it has been difficult to reduce the resistance of a diffusion layer interconnection, since a silicide film is coagulated due to a thermal processing in high temperatures in forming the LOCOS region. In contrast, in the SONOS memory according to the present embodiment, silicide film 9 can be formed at the surface of $n^+$ diffusion layer 7, since formation of the LOCOS region when forming a cell is not necessary, whereby the resistance of the diffusion layer interconnection is reduced.

Forming silicide film 9 at the surface of $n^+$ diffusion layer 7, the electric resistance of diffusion layer 7 can be reduced. Here, using sidewall insulating film 8, a Salicide (Self-Aligned-Silicide) process can be applied, in which silicide film 9 is formed on $n^+$ diffusion layer 7 in a self-aligning manner.

Next, referring to FIGS. 1–10, a method for manufacturing the SONOS memory shown above will be described.

As shown in FIGS. 1–10, a method for manufacturing a SONOS memory (a semiconductor memory device) according to the present embodiment includes the steps of: forming an ONO film 2, 3 and 4 on a main surface of a silicon substrate 1 (FIG. 1); forming a polysilicon film 5 as a first conductive film on ONO film 2, 3 and 4 and forming a nitride film 6 as a mask film on polysilicon film 5 (FIG. 2); performing etching using nitride film 6 and thereby forming an opening reaching the main surface through ONO film 2, 3 and 4 and polysilicon film 5 (FIG. 3); forming an $n^+$ diffusion layer 7 by injecting an impurity into a surface of silicon substrate 1 inside the opening (FIG. 4); depositing an HDP oxide film 10 as an insulating film inside the opening (FIGS. 7 and 8); removing nitride film 6 (FIG. 9); and forming a doped polysilicon film 11 as a second conductive film so as to cover polysilicon film 5 and HDP oxide film 10 (FIG. 10).

Figure 5:
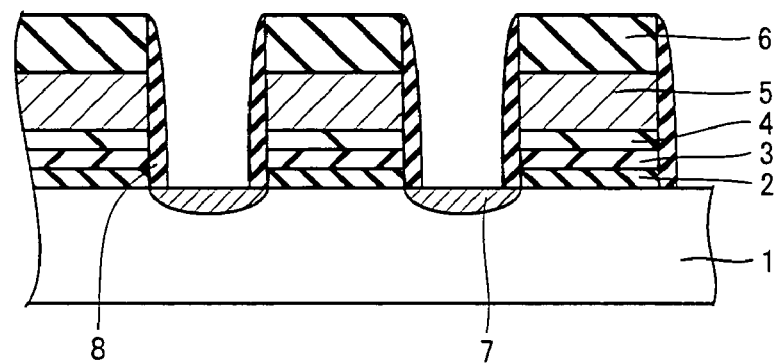
Figure 6:
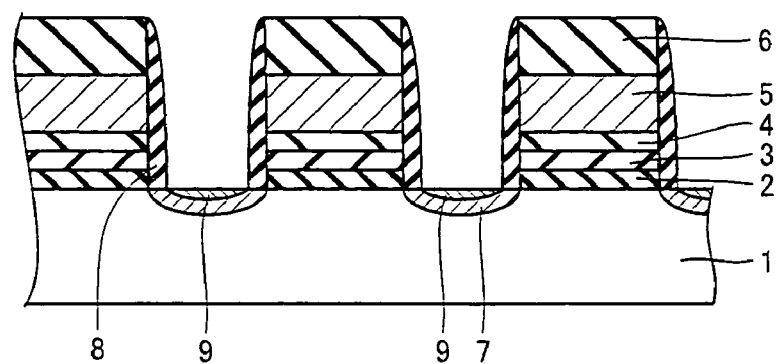

The above-described manufacturing method further includes, between the step of forming $n^+$ diffusion layer 7 and the step of depositing HDP oxide film 10 inside the opening, the steps of: forming a sidewall insulating film 8 at a wall face of the opening (FIG. 5); and forming a silicide film 9 on a region enclosed by sidewall insulating film 8 in $n^+$ diffusion layer 7 (FIG. 6). Performing the steps described above, a semiconductor memory device in the structure shown in FIG. 10 is formed.

Performing the steps described above, a SONOS memory advantageous in scaling can be provided as described above.

In the following, the manufacturing procedure shown above will be described in further detail.

Figure 1:
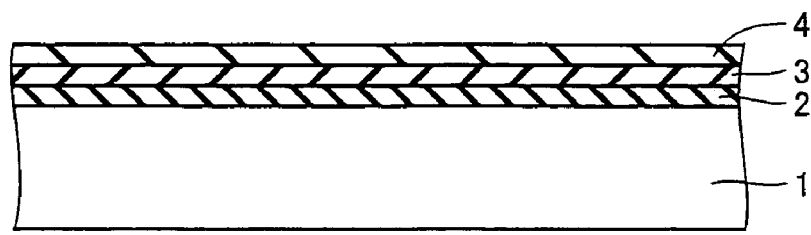
FIGS. 1–9 are cross-sectional views showing first to ninth semiconductor memory device manufacturing steps according to one embodiment of the present invention.

First, as shown in FIG. 1, on silicon substrate 1, a stack-structured film (ONO film) formed by oxide film 2, nitride film 3 and oxide film 4 is formed by, for example CVD (Chemical Vapor Deposition) method or the like. This ONO film serves as a charge holding layer in the SONOS memory.

Figure 2:
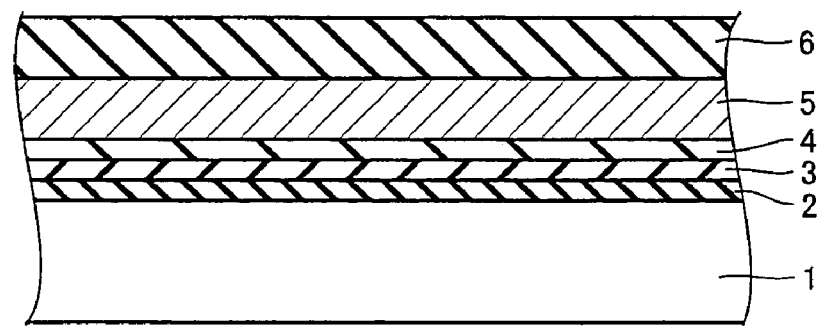

Next, as shown in FIG. 2, polysilicon film 5 is formed on ONO film 2, 3 and 4 having a thickness of about at least 50 nm and at most 100 nm, and a nitride film 6 is formed on that polysilicon film 5 in a thickness of about 100 nm. Polysilicon film 5 and nitride film 6 are formed by, for example CVD method or the like.

Figure 3:
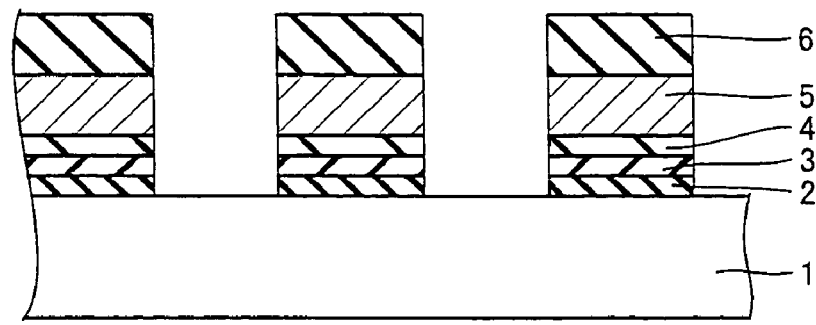

On nitride film 6, a resist pattern corresponding to the pattern of a diffusion layer interconnection region of the cell array is formed, and nitride film 6 is removed by, for example dry etching. Further, after removing the resist, nitride film 6 is used as a mask and polysilicon film 5 and ONO film 2, 3 and 4 are successively etched and removed, whereby an opening is formed in a diffusion layer interconnection region. Thus, the structure shown in FIG. 3 is obtained.

Figure 4:
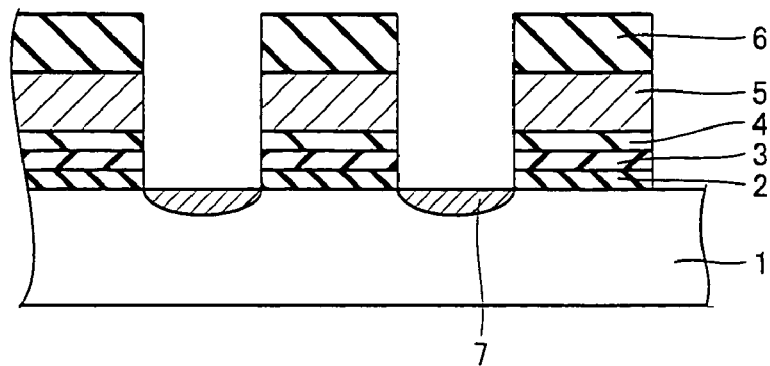

Next, in the above-described diffusion layer interconnection region, an impurity such as arsenic ($n^+$ diffusion layer 7) is injected. As an exemplary injection energy and the amount of injection (ion concentration), for example about 40 (KeV) and $1.0 \times 10^{15}$ (1/cm$^2$) may be possible. Thus, the structure shown in FIG. 4 is obtained.

Using CVD method or the like, an insulating film such as TEOS (Tetra Ethyl Ortho Silicate) oxide film is deposited about 50 nm. Thereafter, performing anisotropy dry etching, sidewall insulating film 8 is formed on a wall face inside the opening as shown in FIG. 5.

For example, cobalt, nickel, titanium or the like is deposited by sputtering method, and a lamp anneal processing is performed at about 400° C. Thus, as shown in FIG. 6, silicide film 9 is formed at a surface of $n^+$ diffusion layer 7 enclosed by sidewall insulating film 8. Then, the lamp anneal processing is again performed at about 800° C. to reduce the resistance of silicide film 9.

Figure 7:
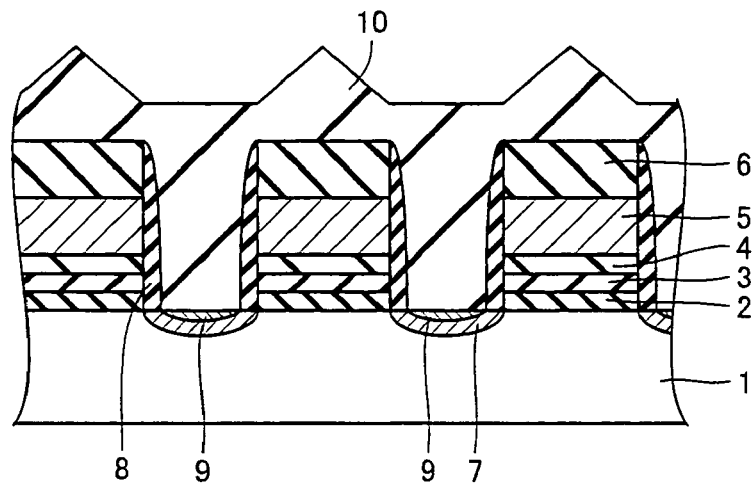

Next, as shown in FIG. 7, for example using high density plasma (HDP) CVD method, HDP oxide film 10 is deposited about 300 nm.

Figure 8:
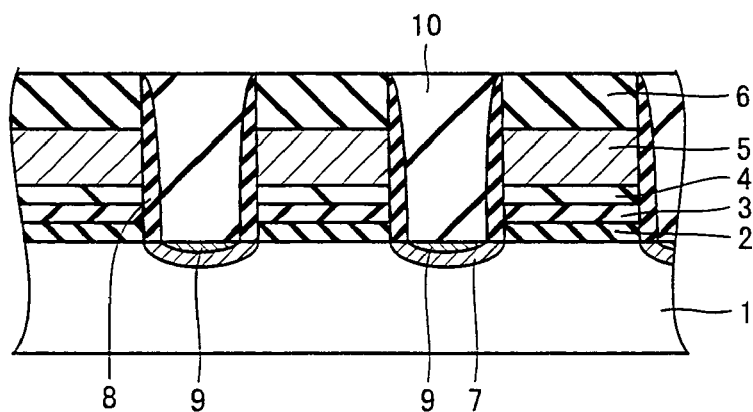

Then, as shown in FIG. 8, for example using CMP (Chemical Mechanical Polishing) method or the like, HDP oxide film 10 is polished to expose nitride film 6 on polysilicon film 5.

Figure 9:
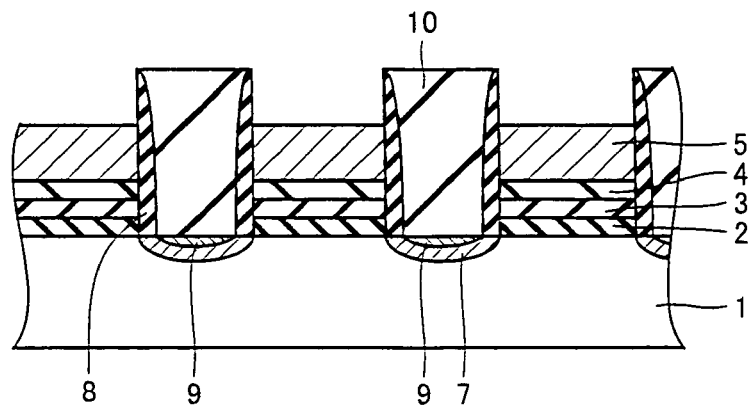

Further, by adding an acid solution, nitride film 6 is removed as shown in FIG. 9. Then, to polysilicon film 5 that serves as a gate electrode in the SONOS memory according to the present embodiment, an impurity such as phosphorus is injected by about $2.0 \times 10^{15}$ (1/cm$^2$) at an injection energy of about at least 5 (KeV) and at most 10 (KeV) to change silicon film 5 to n-type.

Then, as shown in FIG. 10, using CVD method or the like, n-type doped polysilicon film 11 is deposited on polysilicon film 5. Here, for reducing the resistance of the gate electrode, doped polysilicon film 11 is doped with an impurity of n-type such as phosphorus. Here, when silicon film 11 is deposited, it is preferable to employ a scheme for processing wafers one by one (a single wafer processing). Thus, the thermal processing period affecting silicide film 9 can be reduced, and the resistance of bit lines of the SONOS memory can further be reduced.

Next, on doped polysilicon film 11, a resist pattern corresponding to the pattern of word line is formed, and silicon film 5 and 11 in regions except for the word line are removed.

Figure 11:
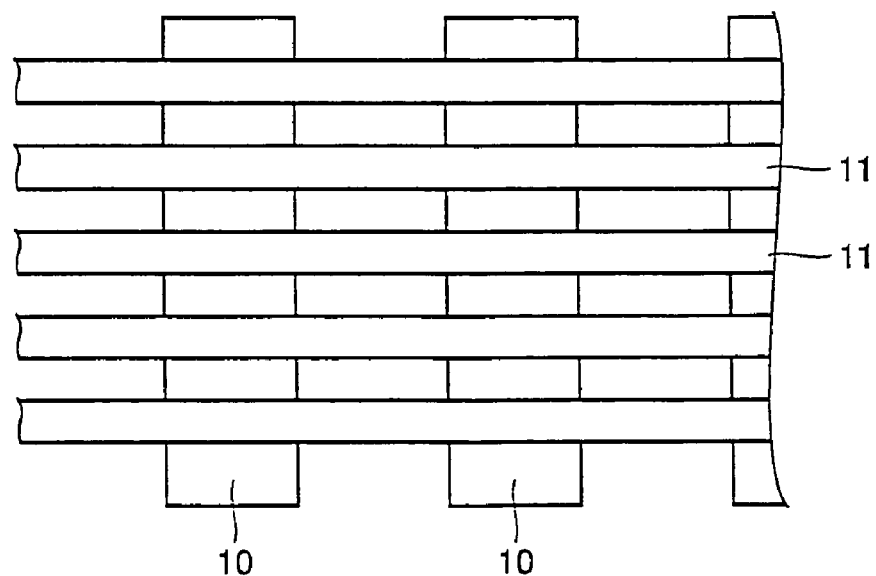
FIG. 11 is a top view of a semiconductor memory device according to one embodiment of the present invention.

FIG. 11 is a top view of the semiconductor memory device according to the present embodiment. In FIG. 11, $n^+$ diffusion layer 7 (a bit line) formed below HDP oxide film 10 and silicon film 5 and 11 (word line) as a gate electrode are electrically isolated by oxide film 10.

In the present embodiment, with the structure described above, a SONOS memory in which bit lines and the like are lower in resistance than a conventional SONOS memory and diffusion of the impurity region is suppressed, and that is suitable for scaling can be provided.

It should be noted that, application of the characteristics of the SONOS memory according to the present embodiment to MONOS (Metal-Oxide-Nitride-Oxide-Semiconductor) memory, for example, is originally contemplated.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:
   a semiconductor substrate having a main surface;
   first and second impurity regions formed on said main surface of said semiconductor substrate distanced from each other;
   first and second insulating films formed on said first and second impurity regions, respectively, and deposited on said main surface so as to protrude above said main surface;
   an ONO (Oxide-Nitride-Oxide) film formed between said first and second insulating films;
   a gate electrode extending over said ONO film and said first and second insulating films; and
   a sidewall insulating film formed on a sidewall of said first and second insulating films and reaching said impurity region.

2. The semiconductor memory device according to claim 1, wherein
   upper surfaces of said first and second insulating films are positioned higher than an upper surface of said ONO film,
   said gate electrode has a downwardly-protruding portion on said ONO film,
   said sidewall insulating film is further formed on a sidewall of said downwardly-protruding portion, and
   a suicide film is formed at a surface of said first and second impurity regions that is not covered by said sidewall insulating film.

* * * * *